(12) United States Patent
Patel et al.

(10) Patent No.: US 9,842,772 B2
(45) Date of Patent: Dec. 12, 2017

(54) METHOD OF ETCHING

(71) Applicant: SPTS TECHNOLOGIES LIMITED, Newport (GB)

(72) Inventors: Jash Patel, Somerset (GB); Janet Hopkins, Monmouthshire (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 14/678,048

(22) Filed: Apr. 3, 2015

(65) Prior Publication Data

US 2015/0287637 A1 Oct. 8, 2015

(30) Foreign Application Priority Data

Apr. 4, 2014 (GB) .................................. 1406135.2

(51) Int. Cl.
| | | |
|---|---|---|
| *H01L 21/768* | (2006.01) | |
| *H01L 21/3065* | (2006.01) | |
| *H01L 21/66* | (2006.01) | |
| *H01L 21/67* | (2006.01) | |
| *H01J 37/32* | (2006.01) | |

(52) U.S. Cl.
CPC ...... *H01L 21/76898* (2013.01); *H01J 37/321* (2013.01); *H01J 37/32706* (2013.01); *H01J 37/32715* (2013.01); *H01L 21/3065* (2013.01); *H01L 21/67069* (2013.01); *H01L 22/12* (2013.01); *H01L 22/26* (2013.01)

(58) Field of Classification Search
CPC ........... H01L 21/3065; H01L 21/67069; H01L 21/76898
See application file for complete search history.

(56) References Cited

U.S. PATENT DOCUMENTS

| | | |
|---|---|---|
| 6,432,834 B1 | 8/2002 | Kim |
| 2011/0318933 A1 | 12/2011 | Yatsuda et al. |
| 2012/0064726 A1 | 3/2012 | Nozawa et al. |
| 2013/0052833 A1 | 2/2013 | Ranjan et al. |
| 2013/0137195 A1 | 5/2013 | Ansell |

FOREIGN PATENT DOCUMENTS

| | | |
|---|---|---|
| EP | 1 420 438 A2 | 5/2004 |
| JP | H11330059 A | 11/1999 |
| WO | WO2008103456 A2 | 8/2008 |

OTHER PUBLICATIONS

Thomas, Dave et al., "Plasma Etch and Low Temperature PECVD Processes for via Reveal Applications," Electronic Components and Technology Conference, May 29, 2012, pp. 1662-1667.
EPO Search Report dated Sep. 1, 2015 related to EPO Application No. 15162490.5-1555.

*Primary Examiner* — Seahvosh Nikmanesh
(74) *Attorney, Agent, or Firm* — Volentine & Whitt, PLLC

(57) ABSTRACT

A method is for etching a semiconductor substrate to reveal one or more features buried in the substrate. The method includes performing a first etch step using a plasma in which a bias power is applied to the substrate to produce an electrical bias, performing a second etch step without a bias power or with a bias power which is lower than the bias power applied during the first etch step, and alternately repeating the first and second etch steps.

21 Claims, 4 Drawing Sheets

METHOD OF ETCHING

BACKGROUND

This invention relates to methods of etching a semiconductor substrate, with particular, but by no means exclusive, reference to the etching of a semiconductor substrate to reveal one or more features buried in the substrate such as vias. A claim of priority is made to United Kingdom (UK) Patent Application No. 1406135.2, filed on 4 Apr. 2014, the disclosure of which is incorporated herein by reference in its entirety.

Through Silicon Vias (TSV) are vertical electrical connections typically filled with copper which extend vertically through silicon wafers. TSVs are important components in the creation of 3D packages and 3D integrated circuits. During the manufacturing process, it is typical for the electrically conductive via material to be protected with an outer liner formed from a suitable protective material such as a silicon oxide.

In the manufacturing process, the TSVs, including the protective layers, are initially buried within a silicon substrate. Via reveal etching involves etching the silicon substrate so as to reveal the upper tips of the TSVs. To achieve optimal results with a via reveal etch, it is considered necessary to satisfy three criteria. Firstly, the etch should achieve a high etch rate with good uniformity. Secondly, it is necessary to achieve a high silicon to oxide etch selectivity in order to maintain the oxide protective liner on the TSV. This prevents exposure of the underlying electrically conducted material (such as copper) to the process gases and plasma which are ubiquitously used to achieve the etch. A silicon to oxide selectivity of greater than 100:1, and preferably greater than 150:1, is considered desirable for this purpose. Thirdly, the final silicon surface achieved at the end of the etch process should be as smooth as possible. It is necessary to achieve a smooth surface in order to prevent problems in subsequent steps of the manufacturing process, for example optical inspection failures due to the wafer having unacceptable properties of reflection, alignment problems, and problems associated with laser dicing. In practice, there is a fine balance between surface roughness and etch selectivity. More specifically, processes and process parameters which can result in good selectivity can also result in a high level of surface roughness. The reverse is also true. For example, it is known that the use of a high bias power during plasma etching can achieve low silicon roughness levels; however, this results in poor oxide selectivity. It is particularly difficult to balance these different criteria in a continuous process. However, continuous processes are desirable in terms of efficiency. A further problem is that surface roughness increases with the depth of silicon removed.

SUMMARY

The present invention, in at least some of its embodiments, addresses the above described problems and needs. Although the invention is particularly useful in TSV reveal etching, it has utility more generally in semiconductor etching processes.

For the avoidance of doubt, the term "A to B selectivity" expressed herein as a ratio is understood to refer to the ratio of the etch rate of A to the etch rate of B. For example, a silicon to silicon dioxide selectivity of greater than 150:1 means that the etch rate of silicon is greater than 150 times the etch rate of silicon dioxide.

According to a first aspect of the invention there is provided a method of etching a semiconductor substrate to reveal one or more features buried in the substrate, the method including the steps of:

performing a first etch step using a plasma in which a bias power is applied to the substrate to produce an electrical bias;

performing a second etch step without bias power or with a bias power which is lower than the bias power applied during the first etch step; and alternately repeating the first and second etch steps.

The method is compatible with high etch rate processes and with continuous operation. The method can be advantageous when it is desirable to balance one process parameter or property against another. The method is particularly applicable when it is desirable to balance etch selectivity for the semiconductor substrate and the features against post-etch surface morphology, for example surface roughness.

The bias power may be pulsed during the first etch step. The bias power may be pulsed with a duty cycle in the range 10 to 50%. A bias power of 250 W or more may be used when the bias power is pulsed.

Alternatively, the bias power may be applied to the substrate continuously during the first etch step. A bias power of 75 W or more may be used when the bias power is applied continuously.

The second etch step may be a plasma etch step. Alternatively, the second etch step may employ a non-plasma etch step, such as a wet etch.

However, it is believed that the use of a plasma to perform a second etch step is likely to be the most acceptable from a commercial point of view.

Generally, the bias power or powers are RF powers. Generally, the semiconductor substrate, is positioned on a substrate support and an RF signal is applied to a substrate support in order to produce the electrical bias.

The features may include an outer protective layer. The outer protective layer may be an oxide layer.

The features may be vias. The features may be TSVs. The vias may include outer protective layers such as an oxide layer. The oxide layer may be $SiO_2$. Silicon dioxide may be deposited by CVD (chemical vapour deposition) such as LPCVD (low pressure CVD) or PECVD (plasma enhanced CVD). Other materials, such as low k SiOC or SiOF, might be used.

The TSVs may each include an outer protective layer of silicon dioxide. The semiconductor substrate may be silicon. The second etch step may be performed either without a bias power or with a bias power which is lower than the bias power applied during the first etch step so as to produce a silicon to silicon dioxide selectivity of greater than 100:1, preferably greater than 150:1.

The first and second etch steps may be alternately repeated to produce a surface roughness Ra as measured by atomic force microscopy of 2 nm or less, preferably 1 nm or less.

The semiconductor substrate may be silicon. However, the invention can be applied to other semiconductor materials.

The first and second steps may be alternately repeated at least ten times. The skilled reader will appreciate that the number of times the first and second steps are alternately repeated (the number of cycles) can be any number suitable to achieve the required process end point. In particular, there is no particular upper limit to the number of cycles.

The first and second etch steps may each be performed for a time in the range 0.5 to 10 seconds. The use of relatively short time periods for the etch steps can be beneficial. For example, surface roughness may be significantly reduced and etch selectivity may be increased.

The first etch step and, optionally, the second etch step may be performed using a plasma formed using a fluorine containing gas. The fluorine containing gas may be $SF_6$ or a mixture of etching gases including $SF_6$.

The first etch step may be performed with a bias power which is high enough to achieve an acceptably low degree of surface roughness.

The second etch step may be performed with a bias power which is lower than the bias power used in the first etch step in order to provide improved selectivity for etching the semiconductor substrate in relation to etching of the features. In these embodiments, the bias power may be 50V or less. However, it is preferred that no bias power is applied in order to achieve improved etch selectivity.

Generally, a plurality of process parameters are associated with the first and second etch steps. The process parameters may be altered during the course of the etching. The process parameters may be altered when a process condition is detected. The process condition detected may be the revealing of the features. The process condition detected may be the revealing of the upper portion or portions of one or more TSVs.

The order of the first and second steps is not critical, in terms of whether the method commences with the first etch step or the second etch step.

Bias power may be applied during both the first and second etch steps. In some embodiments, bias power is pulsed during one etch step and applied continuously during the other etch step. In these embodiments, the time averaged power during each etch step, rather than the peak power during a pulse, which may be used to consider which bias power is lower than the other.

According to a second aspect of the invention there is provided a method of etching an unmasked semiconductor substrate including the steps of:

performing a first etch step using a plasma in which a bias power is applied to the substrate to produce an electrical bias;

performing a second etch step without a bias power or with a bias power which is lower than the bias power applied during the first etch step; and alternately repeating the first and second etch steps.

According to a third aspect of the invention there is provided apparatus for etching a semiconductor substrate including:

a chamber;

a substrate support positioned within the chamber for supporting the semiconductor substrate;

at least one plasma production device for producing at least one plasma for use in etching the semiconductor substrate;

a bias power supply for supplying a bias power which can be applied to the substrate to produce an electrical bias; and at least one control device configured to control the plasma production device, the bias power supply and, optionally, a further etching device so that, in use, the apparatus alternately repeats a first and a second etch step, in which: the first etch step uses a plasma generated by the plasma production device to etch the semiconductor substrate, and during the first etch step the bias power supply supplies a pulsed bias power; and the second etch step is performed without a bias power or with the bias power supply supplying a bias power which is lower than the bias power supplied during the first etch step.

Typically, the second etch step is also a plasma etch step, and the same plasma production device or devices are used in both the first and second etch steps.

Whilst the invention has been described as above, it extends to any inventive combination of the features set out above, or in the following description, drawings and claims. For example, any feature described in relation to the first aspect of the invention may be utilised in connection with the second or third aspects of the invention.

BRIEF DESCRIPTION OF THE DRAWINGS

Embodiments of methods and apparatus in accordance with the invention will now be described with reference to the accompanying drawings, in which.

DETAILED DESCRIPTION

The invention provides etching of semiconductors in a cyclic process. The etching alternates between a step in which a plasma etch is performed using a bias power, and a second etch step in which there is no bias power, or a lower bias power is used. The invention will now be exemplified in connection with TSV reveal etching. However, the invention can be utilised in other etching applications.

Figure 1A:
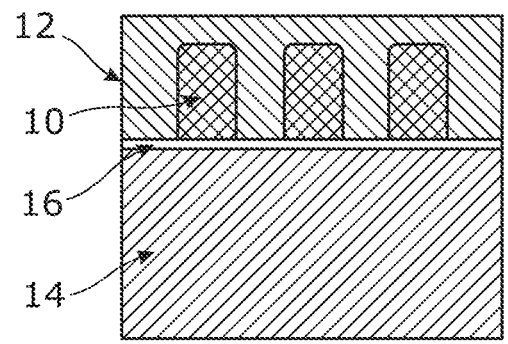
FIG. 1(a) shows buried TSVs prior to etching.
Figure 1B:
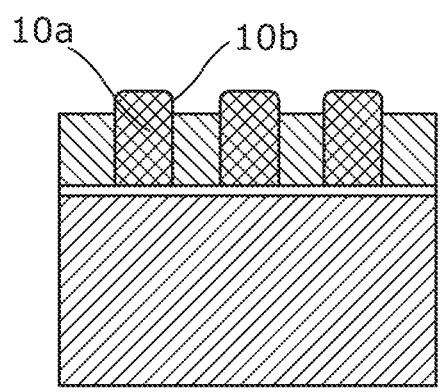
FIG. 1(b) shows exposed TSVs after a via reveal etch.

FIG. 1 shows a TSV reveal silicon etch process. FIG. 1(a) shows TSVs 10 buried within a silicon wafer 12 prior to etching. The silicon wafer 12 is bonded to a carrier wafer 14 by an adhesive layer 16. The carrier wafer 14 can be of any suitable material such as silicon or glass. Etching is performed to reveal the TSVs 10, as shown in FIG. 1(b). It is noted that each TSV 10 comprises an electrically conductive material 10a which is coated with a protective oxide liner 10b. The electrically conductive material is generally a metal, such as copper. It is important that there is no exposure of the underlying electrically conductive material 10b to the harsh conditions of the plasma. This in turn places a process requirement that the etching proceeds with a high silicon to oxide selectivity.

Figure 2:
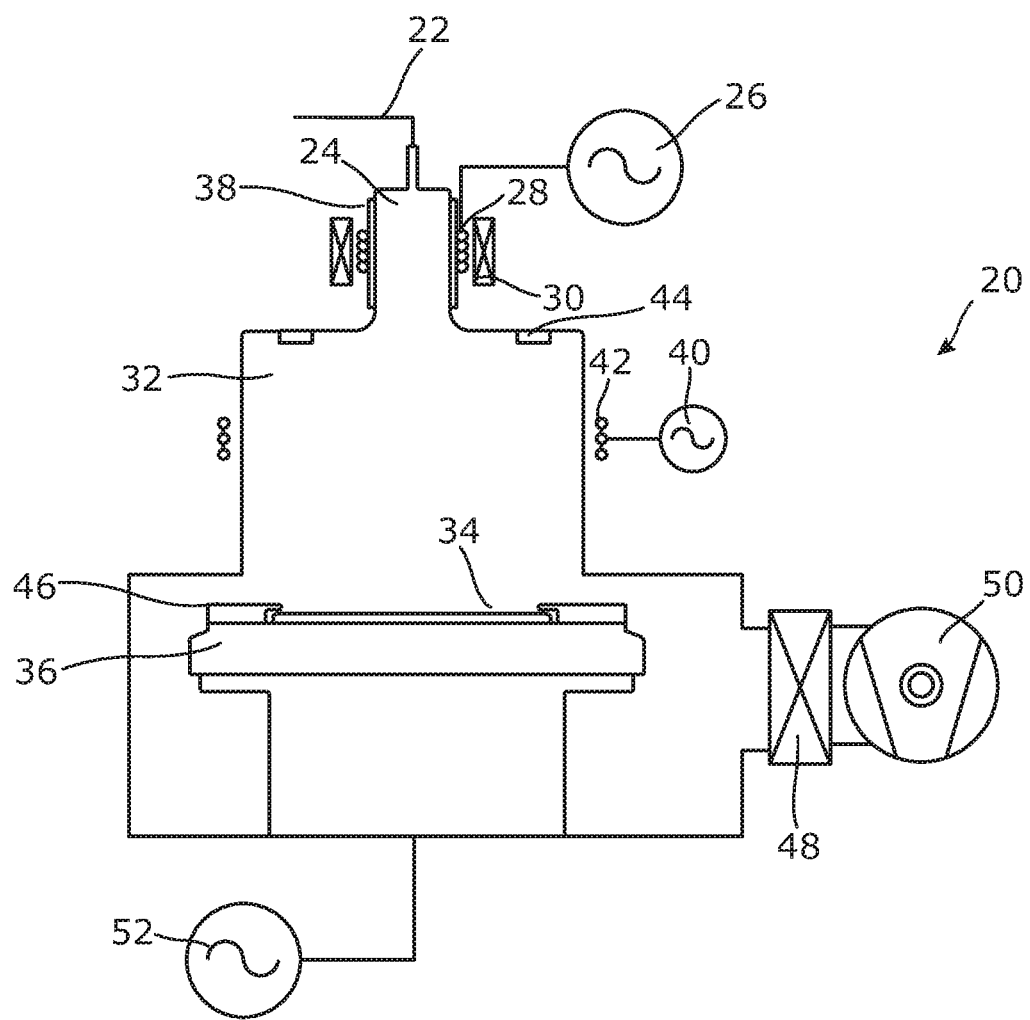
FIG. 2 shows apparatus suitable for performing the invention.

FIG. 2 shows an etching apparatus, depicted generally at 20, which may be used to perform etching of the invention. A primary gas feed 22 enters a primary chamber 24 which has an associated primary ionisation source 26. An RF antenna 28 acts as an ICP source. This can be assisted by a DC coil 30 to modify the confinement of the plasma produced. A Faraday shield 38 can be provided between the DC coil 30 and the wall of the primary chamber 24 to reduce capacitive coupling. The plasma from the primary source enters a main chamber 32 where a wafer 34 to be processed is placed on a wafer support platen 36, which in this embodiment is an electrostatic chuck. A pressure of helium is applied to the underside of the electrostatic chuck for cooling purposes. The main chamber 32 has a secondary ionisation source 40 having a secondary RF coil 42 placed around the main chamber 32 to provide a secondary plasma close to the chamber wall. The RF coil 30 operates at any convenient frequency, typically 13.56 MHz. The RF coil 42 could also operate at 13.56 MHz, or at a lower frequency such as 1-2 MHz. An annular gas distribution system 44 is incorporated into the main chamber 32 to provide an independent gas source for the secondary plasma. The edge of the wafer 34 may be protected by a wafer edge protection (WEP) device 46. The apparatus is pumped through a gate valve 48 by a turbo pump 50. A bias RF source 52 is used to supply an RF signal to the wafer support 26. In this way, a bias power may be applied to the wafer support platen and consequently to the wafer 34.

Etching apparatus of this type, having two RF coils to produce two plasmas, are produced commercially by the applicant under the trade name Pegasus (RTM). However, the skilled reader will appreciate that the invention is in no way limited to twin RF coil apparatus of this type. In fact, the invention can be implemented over a wide range of plasma etching apparatus.

The invention provides cyclic etching in which first and second etch steps are alternately repeated. In the first etch step, a bias power is applied to the wafer support 36 by the RF source 52. The bias power can be applied continuously during the first etch step, in which instance power of around 100 W has been found to be suitable. However, it is preferred that the bias power is pulsed during the first etch step. For pulsed bias power, a power of 500 W pulsed with a 20% duty cycle has been found to be suitable. In the second etch step, it is preferred that no RF bias power is applied. The length of each of the first and second etch steps can be selected according to the specific application envisaged. In general, each of the first and second etch steps are performed for a time in the range 0.5 to 10 seconds. Typical periods are 3 seconds for each first etch step and 6 seconds for each second etch step, at least at the beginning of the process. The total number of cycles depends upon the etch rate and the target depth. The total number of cycles required can be either predetermined or controlled according to the progress of the etching process.

Table 1c) shows an example of process conditions utilised. Tables 1a and 1b show process conditions which were used to produce comparative data.

TABLE 1a

0 W bias process (BT1 = "breakthrough" step prior to etch step)

| Step Name (units) | BT1 | Etch |
|---|---|---|
| Step Time (sec) | 30 | 150 |
| Pressure (Torr) | 85 | 85 |
| Platen Power (Watts) | 50 | 0 |
| Source Power (Watts) | 4000 | 4000 |
| Secondary Power | 3750 | 3750 |
| Primary gas SF6 | 1000 | 1000 |
| Secondary gas SF6 | 400 | 400 |
| He Pressure (Torr) | 15 | 15 |

TABLE 1b

100 W process (BT1 = "breakthrough" step prior to etch step)

| Step Name (units) | BT1 | Etch |
|---|---|---|
| Step Time (Sec) | 30 | 150 |
| Pressure (Torr) | 85 | 85 |
| Platen Power (Watts) | 100 | 100 |
| Source Power (Watts) | 4000 | 4000 |
| Secondary Power | 3750 | 3750 |
| Primary SF6 (sccm) | 1000 | 1000 |
| Secondary SF6 (sccm) | 400 | 400 |
| He Pressure (Torr) | 15 | 15 |

TABLE 1c

Looped pulsed process.

| Step Name (units) | Etch | Etch 2 |
|---|---|---|
| Step Time (Sec) | 3 | 6 |
| Loop Num | | 20 |
| Pressure (Torr) | 85 | 85 |
| Platen Power (Watts) | 500 | 0 |
| Platen Mod Duty % | 20 | 20 |
| Source Power (Watts) | 4000 | 4000 |
| Secondary Power (Watts) | 3750 | 3750 |
| Primary SF6 (sccm) | 1000 | 1000 |
| Secondary SF6 (sccm) | 400 | 400 |
| He Pressure (Torr) | 15 | 15 |

In the example shown in Table 1c, the source powers, gas flows, and pressure all remain the same between cycles. However, these parameters could be different between the first etch step and the second etch step and/or they could change over the total time of the etching process. Also, the length of time of the first etch and/second etch steps could be varied as the etching process proceeds. The bias power could also be varied as the etching process proceeds.

The process conditions shown in Table 1 result in a high etch rate (greater than 8.5 microns/min). Whilst it is advantageous that the invention can be applied to high etch rate processes of this type, it can also be applied to etch processes which use lower power and gas flows.

Figures 3A, 3B, 3C:
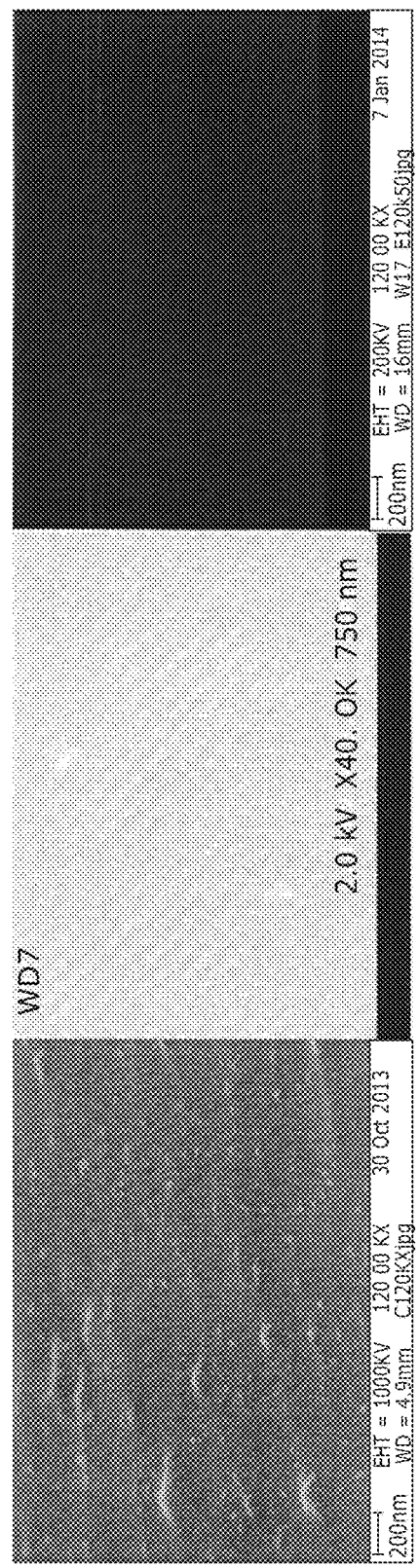
FIG. 3(a) shows a scanning electron microscopy (SEM) image of silicon etched with a 50 W bias for 30 seconds followed by 0 W bias.
FIG. 3(b) shows a scanning electron microscopy (SEM) image of silicon etched with a 100 W bias throughout the etch.
FIG. 3(c) shows a scanning electron microscopy (SEM) image of silicon etched with a cyclic process.

FIG. 3 shows SEM images which indicate how the cyclical process of the invention improves surface roughness. Silicon wafers were etched at ~9 micron/min for 180 seconds to remove ~27 micron of silicon. In processes 1a) & 1b) there is a short 30 sec "break through" BT1 step prior to the bulk etch. This is not required in the process 1c). This short step removes the discontinuity at the wafer surface and is widely used when plasma etching thin films. FIG. 3(a) shows an SEM image of silicon etched a low bias process (Table 1a) conditions) which should maximise selectivity between the Si and SiO$_2$ etch rates. FIG. 3(b) shows an SEM image of silicon etched using a continuous bias of 100 W throughout the etching. As expected, a significantly improved degree of surface roughness is observed. Process conditions for this wafer can be seen in Table 1b). However, as explained in more detail below, the use of this etching process results in unacceptably poor silicon to oxide selectivity.

Figure 4A:
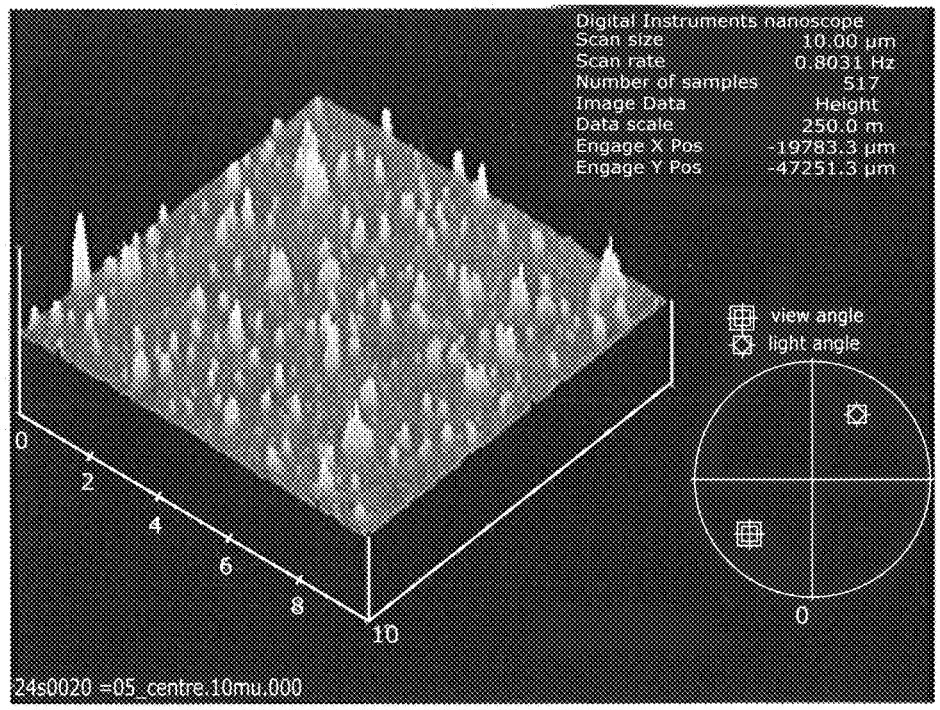
FIG. 4(a) shows atomic force microscopy (AFM) data for silicon etched using a typical process.
Figure 4B:
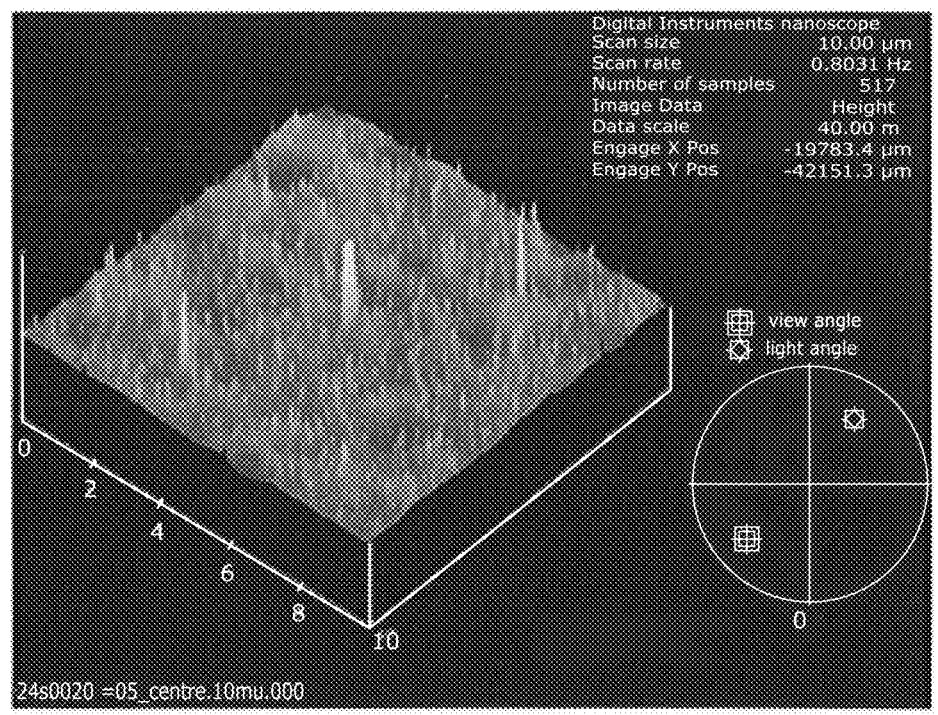
FIG. 4(b) shows atomic force microscopy (AFM) data for silicon etched using a cyclic process.

FIG. 3(c) shows an SEM image of silicon etched according to the cyclic process of the invention using the process conditions described in Table 1c. It can be seen that an excellent surface is obtained, with a low degree of roughness. No visible artefacts can be observed. This is confirmed by AFM data shown in FIG. 4. FIG. 4(a) shows AFM data obtained after a typical prior art process. A surface roughness value Ra of 5.9 nm is observed by using the high selectivity process described in Table 1a). FIG. 4(b) shows AFM data obtained when analysing silicon etched using the process conditions of Table 1c. A smooth surface profile is observed, with a measured roughness Ra of 0.97 nm.

Results for etch selectivity, rate and roughness as a function of the three processes described in Table 1a)-c) are displayed in Table 2.

TABLE 2

Etch rate, selectivity and surface roughness for the three processes described in Table 1.

|  | 0 W bias 1a | 100 W bias 1b | Cyclic process 1c |
|---|---|---|---|
| etch rate (microns/min) | 9.2 | 9.2 | 9.1 |
| selectivity (Si:silicon dioxide) | 360:1 | 70:1 | 170:1 |
| roughness Ra (nm) | 5.9 | n/a | 0.97 |

The data shown in Table 2 clearly demonstrate that the cyclic process (1c) provides a significant improvement in selectivity in comparison to a continuous process utilising a high RF bias of 100 W. Whereas the selectivity (silicon to silicon dioxide) obtained with a continuous 100 W RF bias (70:1) is unacceptable for use in TSV reveal etches, the improved silicon to silicon dioxide selectivity of 170:1 obtained with the cyclic process is acceptable for use in TSV reveal etches. A high silicon to silicon dioxide selectivity is observed with a 0 W bias process, but this gives rise to unacceptably poor surface roughness.

The invention can be combined with end-point detection systems which detect when the tip of the vias are revealed. An end-point detection system of this type is disclosed in the Applicant's earlier European patent application 12192364.3, the entire contents of which are herein incorporated by reference. This end-point detection system can be combined with the present invention. In a relatively simple combination with the present invention, the end-point detection system records the time of the via tip reveal. In a more sophisticated combination, the detection of the via tip reveal is used to trigger an adjustment of the process parameters. Additionally or alternatively, a defined number of cycles can be performed after the tip is revealed in order to achieved a desired exposure height of the via above the final surface of the semiconductor. All of these variants are within the scope of the invention.

What is claimed is:

1. A method of etching an unmasked semiconductor substrate to reveal one or more features buried in the substrate, the method including:
   a first etch step of etching the unmasked semiconductor substrate using a plasma and during which a bias power is applied to the substrate to produce an electrical bias; and
   a second etch step of etching the substrate without a bias power being applied to the substrate or during which a bias power which is lower than the bias power applied during the first etch step is applied to the substrate, and wherein the first and second etch steps are performed alternately and repeatedly such that the substrate is etched in a plurality of cycles each including the first etch step followed by the second etch step.

2. A method according to claim 1 in which the bias power is pulsed during the first etch step.

3. A method according to claim 2 in which the bias power is pulsed with a duty cycle in the range 10 to 50%.

4. A method according to claim 1 in which the bias power is applied to the substrate continuously during the first etch step.

5. A method according to claim 1 in which the second etch step is a plasma etch step.

6. A method according to claim 1 in which the bias power or powers are RF powers.

7. A method according to claim 1 in which the semiconductor substrate is silicon.

8. A method according to claim 1 in which the features include an outer protective layer.

9. A method according to claim 8 in which the outer protective layer is an oxide layer.

10. A method according to claim 1 in which the features are vias.

11. A method according to claim 10 in which the features are Through Silicon Vias (TSVs).

12. A method according to claim 11 in which the TSVs each include an outer protective layer of silicon dioxide, the semiconductor substrate is silicon, and the second etch step is performed either without a bias power or with a bias power which is lower than the bias power applied during the first etch step so as to produce a silicon to silicon dioxide selectivity of greater than 100:1.

13. A method according to claim 11 in which the first and second etch steps are alternately performed and repeated a number of times to produce a surface roughness Ra as measured by atomic force microscopy of 2 nm or less.

14. A method according to claim 1 in which the semiconductor substrate is etched by at least 10 cycles of the first and second etch steps.

15. A method according to claim 1 in which the first and second etch steps are each performed for a time in the range 0.5 to 10s.

16. A method according to claim 1 in which at least the first etch step among the first and second etch steps is performed using a plasma formed using a fluorine containing gas.

17. A method according to claim 1 in which the second etch step is performed with a bias power which is lower than the bias power used in the first etch step in order to provide improved selectivity for etching the semiconductor substrate in relation to etching of the features.

18. A method according to claim 17 in which the second etch step is performed to provide a semiconductor substrate to feature selectivity of greater than 100:1.

19. A method according to claim 1 in which a plurality of process parameters are associated with the first and second etch steps, and the process parameters are altered when a process condition is detected.

20. A method according to claim 19 in which the process condition detected is the revealing of the features.

21. A method of etching an unmasked semiconductor substrate, the method including:
   a first etch step of etching the unmasked semiconductor substrate using a plasma and during which a bias power is applied to the substrate to produce an electrical bias; and
   a second etch step of etching the substrate without a bias power being applied to the substrate or during which a bias power which is lower than the bias power applied during the first etch step is applied to the substrate, and wherein the first and second etch steps are performed alternately and repeatedly such that the substrate is etched in a plurality of cycles each including the first etch step followed by the second etch step.

\* \* \* \* \*